US 6,573,530 B1

(12) United States Patent
Sargent et al.

(10) Patent No.: US 6,573,530 B1
(45) Date of Patent: Jun. 3, 2003

(54) MULTIPLE QUANTUM WELL OPTOELECTRONIC DEVICES

(75) Inventors: Edward H. Sargent, Toronto (CA); Dayan Ban, Toronto (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/969,348

(22) Filed: Oct. 2, 2001

Related U.S. Application Data

(60) Provisional application No. 60/267,879, filed on Feb. 9, 2001.

(51) Int. Cl.[7] .............................................. H01L 29/06
(52) U.S. Cl. .............................. 257/25; 257/9; 257/12; 257/14; 257/76; 257/101; 257/191
(58) Field of Search ........................... 257/144, 76, 99, 257/101, 103, 191, 201, 613, 744, 745, 9, 12, 14, 25

(56) References Cited

U.S. PATENT DOCUMENTS

| 4,671,830 A | | 6/1987 | Burnham .................... 148/186 |
| 5,047,810 A | * | 9/1991 | Chemla et al. ................. 357/4 |
| 5,416,338 A | * | 5/1995 | Suzuki et al. .................. 257/21 |
| 5,673,140 A | | 9/1997 | Fisher ......................... 359/332 |
| 5,956,358 A | | 9/1999 | Sasaki .......................... 372/45 |

OTHER PUBLICATIONS

Ashcroft et al, "Solid State Physics," Electron Levels in a Periodic Potential, Chapter 8, pp. 8.1–8.51, 12–1–12.5, (1976).

Brown et al., "Oscillations up to 420 GHz in GaAs/AlAs resonant tunneling diodes," American Institute of Physics, pp. 1777–1779, (1989).

Ohtoshi, "Suppression of Leakage Current in InGaAsP/InP Buried Heterostructure Lasers by InAlAs Strained Current-Blocking Layers," Electronics Letters, vol. 27, pp. 12–13, (1991).

Yang et al., "Population inversion through resonant interband tunneling," American Institute of Physics, pp. 181–182, (1991).

Kazarinov et al., "Carrier Transport in Laser Heterostructures," IEEE Journal of Quantum Electronic, vol. 30, pp. 49–53, (1994).

Weisser et al., "Impedance Characteristics of Quantum–Well Lasers," IEEE Photonics Technology Letters, vol. 6, pp. 1421–1423, (1994).

Coldren et al., "Diode Lasers and Photonic Integrated Circuits," Gain and Current Relations, pp. 112–120, (1995).

Shen et al., "Static Random Access Memories Based on Resonant Interband Tunneling Diodes in the InAs/GaSb/AlSb Material System." IEEE Electronics Device Letters, vol. 16, p. 178–180, (1995).

Meyer et al., "Type–II and type–I interband cascade lasers," Electronics Letters, vol. 32, pp. 45–46, (1996).

Yamazaki et al., "Evidence of nonuniform carrier distribution in multiple well lasers," American Institute of Physics, pp. 767–769, (1997).

(List continued on next page.)

*Primary Examiner*—Long Pham
*Assistant Examiner*—Wai-Sing Louie
(74) *Attorney, Agent, or Firm*—Nortel Networks

(57) ABSTRACT

A quantum well optoelectronic device exploiting the multistability of the light-current characteristic of a multiple quantum well structure to achieve complex manipulation of the optical output of a light-emitting channel. Intraband tunneling of each of two distinct carrier types gives rise to a nonlinear dependence of optical gain on injected current.

17 Claims, 6 Drawing Sheets

OTHER PUBLICATIONS

Kakimoto et al., "Threshold Currents of 1.3–$\mu$m Bulk, 1.55–$\mu$m Bulk, and 1.55–$\mu$m MQW DFB P–Substrate Partially inverted Buried Heterostructure Laser Diodes." IEEE Journal of Quantum Electronics, vol. 34, pp. 540–547, (Mar. 1998).

Sargent et al., "OEIC–Enabling LCI Lasers with Current Guides: Combined Theoretical–Experimental Investigation of Internal Operating Mechanisms," IEEE Journal of Quantum Electronics, vol. 34, pp. 1280–1287, (Jul. 1998).

Sirtori et al., "Resonant Tunneling in Quantum Cascade Lasers," IEEE Journal of Quantum Electronics, vol. 34, pp. 1722–1729, (Sep. 1998).

Hazell et al., The Effect of Varying Barrier Height on the Operational Characteristics of 1.3–$\mu$m Strained–Layer MQW Lasers.

Zhi et al., "Native–Oxidized InAlAs Blocking Layer Buried Heterostructure InGaAsP–InP MQW Laser for High–Temperature Operation," IEEE Photonics Technology Letters, vol. 11, pp. 3–5, (Jan. 1999).

Piprek, et al., "Carrier nonuniformity effects on the internal efficiency of multiquantum–well lasers," Applied Physics Letter, vol. 74, pp. 489–491, (Jan. 1999).

Hamp et al., "Nonuniform carrier distribution in asymmetric multiple–quantum–well InGaAsP laser structures with different numbers of quantum wells," Applied Physics Letter, vol. 74, pp. 744–746, (Feb. 1999).

Takemasa, et al., "1.3$\mu$m AlGaInAs Buried–Heterostructure Lasers," IEEE Photonics Technology Letters, vol. 11, pp. 949–951, (Aug. 1999).

Yoshida, et al., "Theoretical and Experimental Analysis of Leakage Current in InGaAsP BH Lasers with p–n–p–n Current Blocking Layers," IEEE Journal of Quantum Electronics, vol. 35, pp. 1332–1336, (Sep. 1999).

Aarts et al., "Above–Threshold Leakage in Semiconductor Lasers: An Analytical Physical Model," IEEE Journal of Quantum Electronics, vol. 36, pp. 496–501, (Apr. 2000).

Ban et al., "Influence of Nonuniform Carrier Distribution on the Polarization Dependence of Modal Gain in Multiquantum–Well Lasers and Semiconductor Optical Amplifiers," IEEE Journal of Quantum Electronics, vol. 36, pp. 1083–1088.

Ban et al., "External Electronic and Optical Evidence for Internal Quantum Transport Effects in BH–MQW Lasers," IEEE Electron Devices Society: $27^{th}$ Int Symposium on Compound Semiconductors, Monterey, CA, paper TuBH, (Oct. 2000).

Suematsu, et al., "Single–Mode Semiconductor Lasers for Long–Wavelength Optical Fiver Communications and Dynamics of Semiconductors Lasers," IEEE Journal on Selected Topics in Quantum Electronics, vol. 6, pp. 1436–1449, (Nov./Dec. 2000).

Razeghi, "Optoelectronic Devices Based on III–V Compound Semiconductors Which Have Made a Major Scientific and Technological Impact in the Past 20 Years," IEEE Journal on Selected Topics in Quantum Electronics, vol. 6, pp. 1344–1354, (Nov./Dec. 2000).

Towe, et al., "A historical Perspective of the Development of the Vertical–Cavity Surface–Emitting Laser," IEEE Journal on Selected Topics in Quantum Electronics, vol. 6, pp. 1458–1464, (Nov./Dec. 2000).

\* cited by examiner

MULTIPLE QUANTUM WELL OPTOELECTRONIC DEVICES

The present application claims priority from U.S. Provisional Application, Ser. No. 60/267,879, filed Feb. 9, 2001, which is herein incorporated by reference.

FIELD OF THE INVENTION

The present invention relates generally to optoelectronic devices, and, more particularly, to a multiple quantum well optoelectronic devices for emission and modulation of light.

BACKGROUND OF THE INVENTION

Optical networks require increasingly sophisticated function in the optical domain. Additionally, self-sustained microwave-frequency oscillation is also required to serve as a subcarrier for signals generated and distributed over optical fibers. The present invention addresses limitations in the rate at which higher bandwidth modulation of an optical signal may be achieved by accomplishing the coupling of electronic and optical functions within a single device, thereby circumventing the limiting parasitic effects of external circuitry.

Various mechanisms are believed to impede interwell transport of carriers among the layers of a stack of multiple quantum wells, with carriers of each conductivity type distinctly affected. The result of the mechanisms is a non-uniformity in the distribution of carriers among the various quantum wells of a stack. Carrier density nonuniformity has been seen as limiting device performance.

Other quantum-well-based optical devices, such as described in U.S. Pat. No. 5,673,140, rely on the modulation of refraction or of absorption and thus require an external light source. Further examples of quantum-well based optoelectronic devices are provided by Meyer et al., *Electronics Letters*, vol. 32, pp. 45–46, (1996), Shen et al., *IEEE Electron Device Letters*, vol. 16, pp. 178–180 (1995), and Yang et al., *Applied Physics Letters.*, vol. 59, pp. 181–182, (1991), all of which references are incorporated herein by reference. The modulation of an active light-emitting device, however, requires the modulation of a positive gain which has not been known to be possible, and is addressed for the first time in the teachings of the present invention.

Devices known to exhibit tunneling phenomena are currently limited either to those exhibiting tunneling from one band to another, in the manner of Esaki diodes, or else are restricted to unipolar devices to which carriers of only a single type exhibit intraband tunneling behavior. Such devices are exemplified by those described in Brown et al., "Oscillations up to 420 GHz in GaAs/AlAs resonant tunneling diodes," *Applied Physics Letters* vol. 55, p. 777 (1989).

SUMMARY OF THE INVENTION

In accordance with preferred embodiments of the present invention, there is provided an optical semiconductor device. The semiconductor device has a stack of a plurality of layers of semiconducting material. Within the plurality of layers, at least one quantum well is bounded on each of two sides by an energy barrier with respect to transport of a charge carrier between the at least one quantum well and adjoining material on each of two sides, and the quantum well having at least two bound quantum states with respect to a trapped charge carrier. The device also has an optically active zone including the at least one quantum well, with the optically active zone characterized by an optical gain under forward operation of the device. The device has a first carrier injector for forward-injecting carriers of a first conductivity type into the at least one quantum well and a second carrier injector for forward-injecting carriers of a second conductivity type into the optically active zone at in such a way as to vary the optical gain of the optically active zone.

In accordance with alternate embodiments of the invention, the quantum well may be bounded by two barriers with respect to the transport of holes or with respect to the transport of electrons, or both. One of the barriers may be approximately triangular, so as to enable field-emission through the at least one barrier. In accordance with further embodiments of the invention, thermionic transport of at least one carrier type into the at least one quantum well is precluded at a specified operating temperature and transport of at least one carrier type into the at least one quantum well is by means of resonant tunneling or field-emission tunneling.

In accordance with yet further embodiments of the invention, a non-linear optical semiconductor device is provided that has a a stack of a plurality of layers of semiconducting material having at least one quantum well bounded on each of two sides by an energy barrier with respect to transport of a charge carrier between the at least one quantum well and adjoining material on each of two sides. Electrical current through the stack is a nonmonotonic function of an applied electrical potential across the stack. The device has an associated circuit for modulating an optical gain of a region of the stack by virtue of the nonlinear function of current versus applied electrical potential.

BRIEF DESCRIPTION OF THE DRAWINGS

The accompanying description of various embodiments of the invention should be appreciated more fully with reference to the accompanying drawings wherein.

DETAILED DESCRIPTION OF SPECIFIC EMBODIMENTS

The production of heterostructure devices, by epitaxial growth or otherwise, is known for creating a structure of layered semiconductors with energetic barriers to carrier transport between adjacent layers. The effect of the barriers is to create energetic wells in which charge carriers are classically trapped and in which solution of the Schrödinger equation leads to one or more bound states within a given well. Single or multiple quantum wells of this sort are typically formed using heterostructures of InP alternating with lattice-matched GaInAs, or, alternatively, using lattice-matched quaternary compounds such as GaInAsP, but all choices of materials are encompassed within the scope of the present invention.

Figure 1:
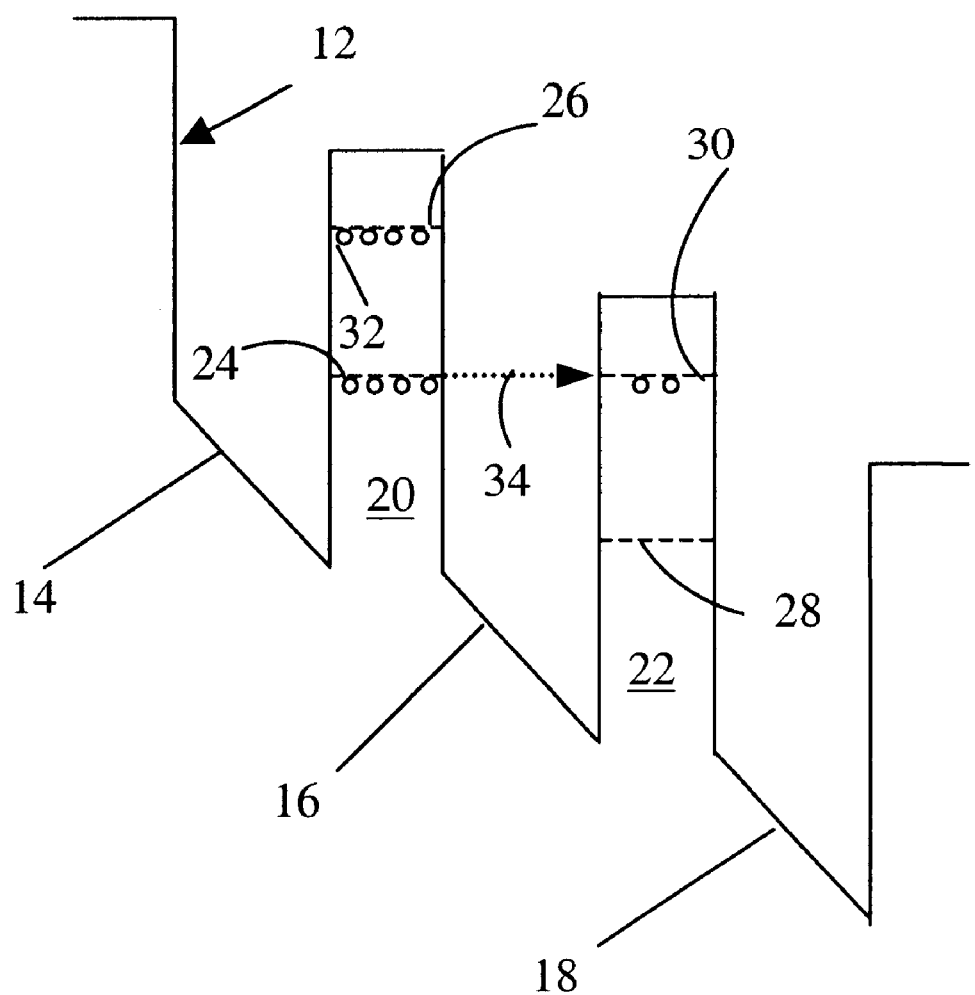
FIG. 1 is an energy-band diagram of a multiple quantum well device showing quantum confined states in accordance with preferred embodiments of the present invention.
Figure 4:
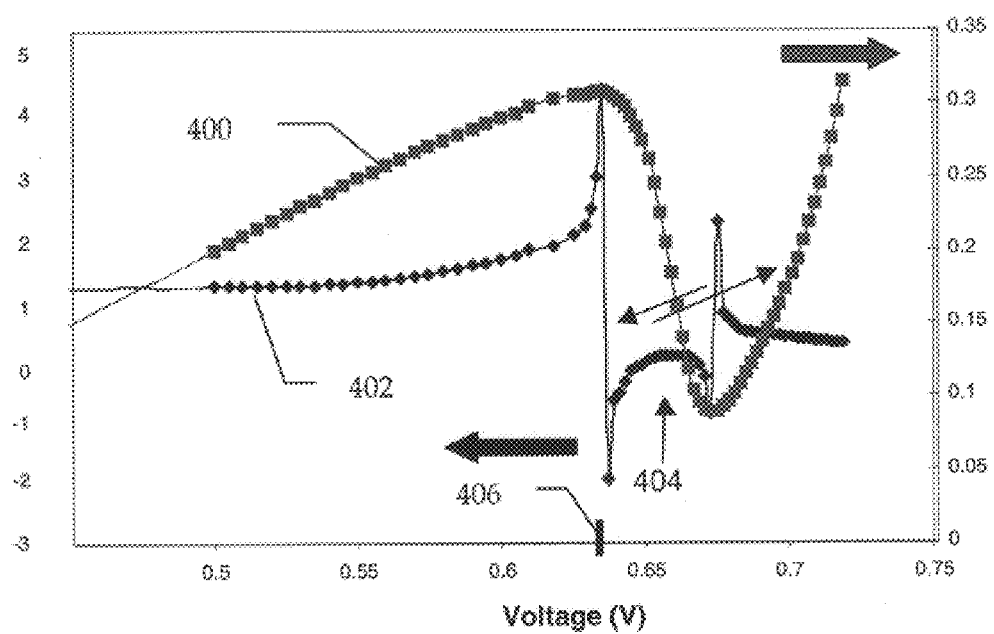
FIG. 4 depicts a typical I-V curve characterizing a multiple-quantum well optoelectronic device in accordance with embodiments of the present invention.

While inter-well carrier transport is classically forbidden, quantum-assisted transport from well to well may give rise to a current-voltage (I-V) characteristic, shown, for example, in FIG. 4, in some cases exhibiting negative differential conductance characteristics, or only high-order differential conductance features. FIG. 1 shows an example of such a multiple quantum well (MQW) structure, designated generally by the numeral 10, in accordance with one embodiment of the present invention. The energy contour of valence band edge 12 is shown as a function of displacement across the device. Energetic barriers 14, 16, and 18 delineate wells 20 and 22. Bounds states of carriers, holes in this case, are shown as dashed lines, 24 and 26 in well 20 and 28 and 30, in well 22.

Additionally, at least some of the semiconductor layers are transparent to light of certain wavelengths, and the physical structuring of light-guiding channels is known in the art. The flow of charge carriers 32 across the device, whether by injection, thermionic emission, tunneling or field emission constitutes a current. Resonant tunneling, for example, enhanced by the resonance of confined state 24 of well 20 with confined state 30 of well 22 is designated in FIG. 1 by dotted arrow 34. Since transitions among confined states may be associated with emission (or absorption) of photons, and thus with optical gain (or loss), the device may similarly be characterized by a light-voltage (L-V) curve of optoelectronic origin, such as depicted, for example, in FIG. 5.

Figure 6:
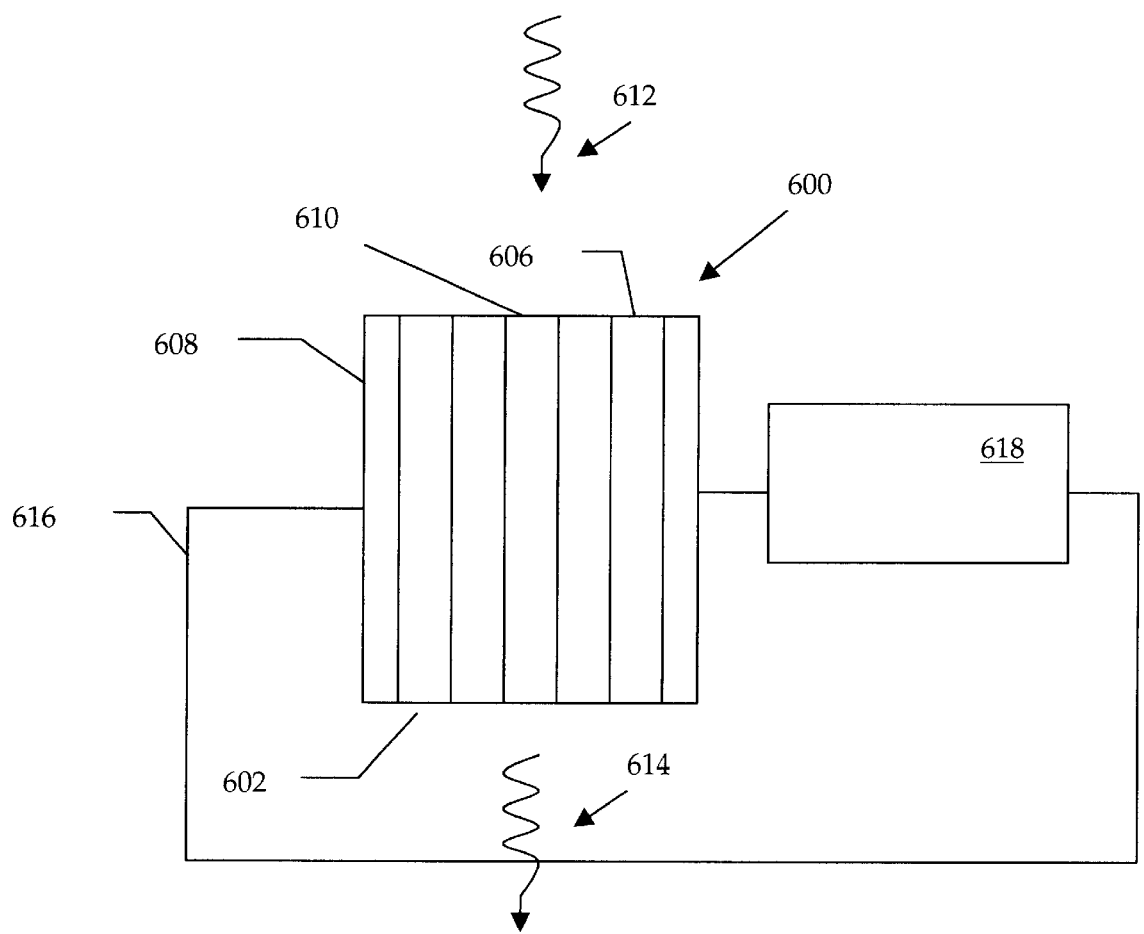
FIG. 6 is a schematic of a quantum-well heterostructure device with an active optical region and an external electronic circuit in accordance with embodiments of the present invention.

In accordance with some embodiments of the present invention, and as depicted schematically in FIG. 6, the band offsets of optically active region 602 of the heterostructure device 600 are designed such that electrons flow freely—through injection, thermionic emission, and tunneling and field emission—from the first quantum well 604 to the final quantum well 606. In contrast, hole transport from the p-type injecting contact 608, corresponding to the left-hand side of the depiction of FIG. 1, is impeded by the height of barriers in the valence band. By virtue of the differential transport, non-linearities are exploited to modulate the optical gain of the active region 610 for incident light 612. Alternatively, light 614 may be emitted due to spontaneous emission in the active region, or, if an inversion obtains within the active region, lasing emission may be achieved. Gain in the action region 610 may be controlled, as discussed below, by means of external electrical circuit 616 containing modulator/controller 618. Circuits exploiting negative resistance to achieve oscillation are well-known in the art. In accordance with the present invention, such circuits may be employed to achieve modulation of optical gain, and, thus, of optical output of the device.

The occupation probabilities in the conduction and valence bands of a semiconductor are usually described using Fermi statistics. Under nonequilibrium conditions (i.e., heavy current injection into the quantum well active region), a separate Fermi level is used for the conduction and valence bands, with the occupation probabilities expressed, respectively, by:

$$f_1 = \frac{1}{1 + e^{(E_1 - E_{Fv})/kT}}$$

and $$f_2 = \frac{1}{1 + e^{(E_2 - E_{Fc})/kT}},$$

where $E_{Fc}$ and $E_{Fv}$ are the conduction and valence band quasi-Fermi levels, k is Boltzmann constant and T is temperature.

A population inversion refers to the case, shown in well 22 of FIG. 1, where the carrier population of a higher-lying bound state 30 exceeds the carrier population of a lower-lying bound state 28. Achieving population inversion in the well 20 closest the p-type injector requires sustaining across this well a quasi-Fermi level separation comparable to the energy separation between the first confined states in this well.

The population inversion factor n, refers to the ratio:

$$n = \frac{f_2(1 - f_1)}{(f_2 - f_1)} = \frac{1}{1 - e^{(E_{21} - \Delta E_F)/kT}},$$

where $E_{21} = E_2 - E_1$, and $\Delta E_F = E_{Fc} - E_{Fv}$. Its value is typically between 1 and 2 at gain thresholds commonly encountered in lasers, requiring $\Delta E_F > E_{21}$. The inversion of population within a well is described in detail in Coldren, et al., *Diode Lasers and Photonic Integrated Circuits*, New York: Wiley, (1995), which is incorporated herein by reference.

In accordance with embodiments of the invention, effective hole transport to subsequent wells is impeded through design of the heterostructure stack and proper biasing of the device. The selective impediment of hole transport gives rise to a net electron-hole charge imbalance which in turn implies, through the Poisson equation relating electric field gradient to charge density, a further voltage drop across these wells.

If an inversion is achieved between quantum levels within a well under forward operation of the device, and if the resultant optical gain at a particular wavelength can overcome net modal loss associated with mirrors and aggregated modal waveguide losses in the optical channel, stimulated emission may give rise to lasing. A discussion of interaction between impeded interwell transport and lasing behavior is provided in Ban et al., "External Electronic and Optical Evidence for Internal Quantum Transport Effects in BH-MQW Lasers," *IEEE Electron Devices Society*: The 27th International Symposium on Compound Semiconductors, Monterey, Calif., paper TuB4, (Oct. 2–5, 2000), which paper, presented Oct. 3, 2000, is incorporated herein by reference.

In accordance with embodiments of the invention, conditions are tailored that are favorable for resonant tunneling of holes, such as shown by arrow 34 in FIG. 1, from well 20 (closest to the p-injector) into well 22 (next-closest to p-injector). Such conditions may involve the establishment of resonance between the first quantum-confined state 24 of the first well 20 and a higher quantum-confined state 30 of the adjacent well 22.

Figure 2:
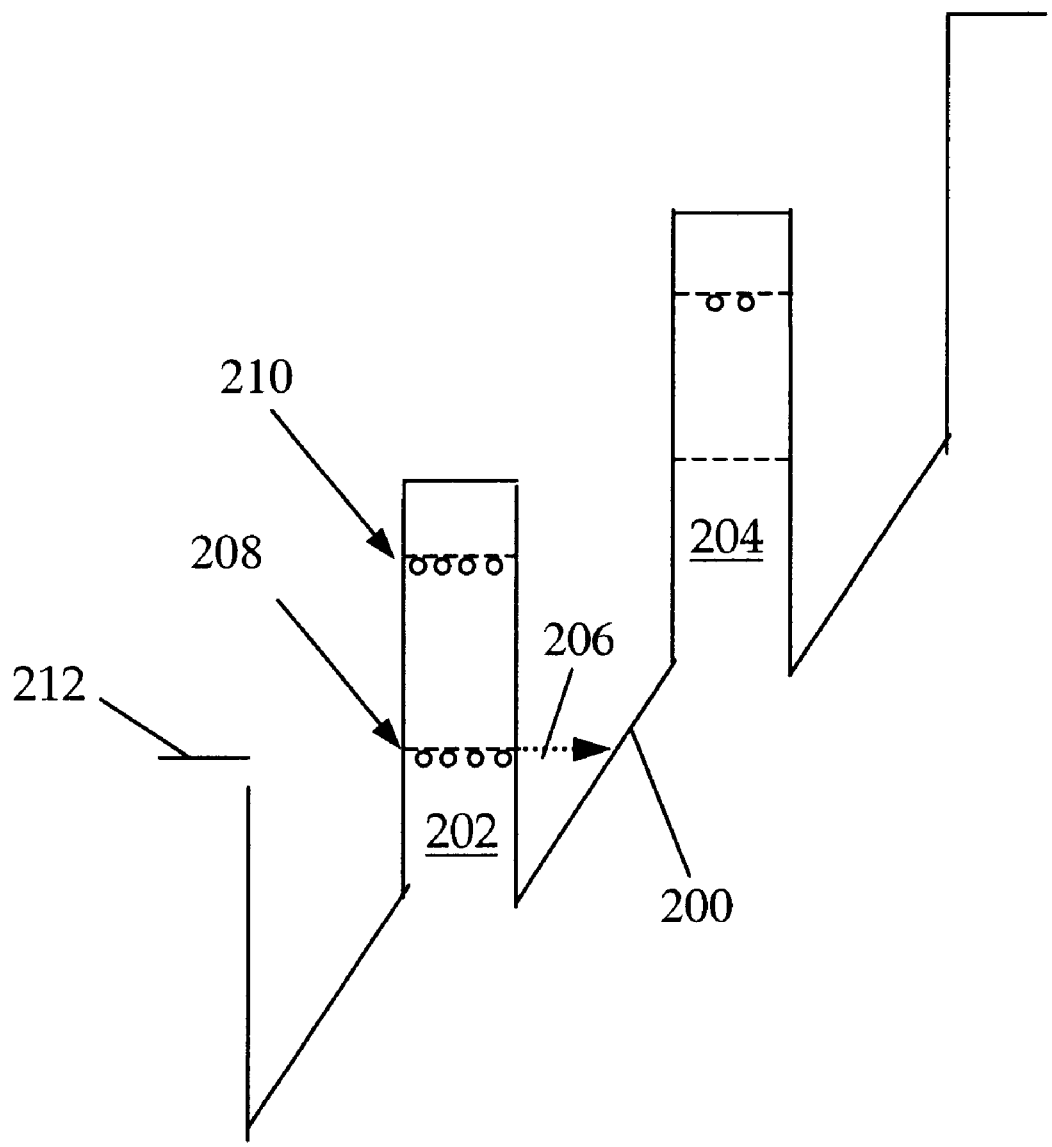
FIG. 2 is an energy-band diagram of a multiple quantum well device showing quantum confined states within wells and the effect of bending of bands between successive wells in accordance with other embodiments of the present invention.

Referring now to FIG. 2, resonant tunneling of carriers may also be achieved, in accordance with other embodiments of the present invention, by the bending of bands in the barrier 200 between a first well 202 and a second well 204. The band is shown relative to valence band edge 212.

Field-emission tunneling through an approximately triangular barrier 200 becomes probable from a quantum confined state 208 in the first well. A higher-lying confined state 210 is also shown. The field-emission tunneling is depicted by a dashed line designated by the numeral 206. Once such conditions are established, the current injected into the second well 204 grows appreciably and the gain provided by this second well grows, increasing dramatically the net gain seen by the lasing mode. Power in the lasing mode grows and the laser settles into a new steady-state in which, with minimal application of further voltage, the current has jumped dramatically due to a combination of greatly increased tunnel current combined with greatly increased stimulated emission associated with a jump in photon density in the presence of stronger modal gain.

In accordance with other embodiments of the present invention, holes, rather than electrons, may be the carriers allowed to flow freely, while electrons are transport-limited. Alternatively, both conductivity types of carriers may experience significant transport limitations by tailoring energetic barriers to the transport of both. In this case, the L-I-V characteristic is governed by the combined effect of transport in the respective bands.

In devices in which the onset of strong current flow into a previously unfilled well arises due to field-emission tunneling, the L-V and I-V characteristics exhibit a monotonically increasing character with hysteresis. Regions between the onset of flow into a subsequent well exhibit a very low rate of growth in current and photon density with voltage.

In devices in which the onset of strong current flow into a previously unfilled well arises due to resonant tunneling into discrete bound states of the newly-filling well, the I-V and L-V characteristics may exhibit negative differential behavior, as indicated by the position of the arrow designated 404 in FIG. 4. Referring now to FIG. 4, a typical current-voltage curve 400 is shown wherein carrier transport is impeded at a certain bias 406 in a quantum electronic device in accordance with the present invention. The differential resistance, dV/dI, is shown by curve 402, and with a region of negative differential resistance region exhibited at the position of arrow 406.

Figure 5:
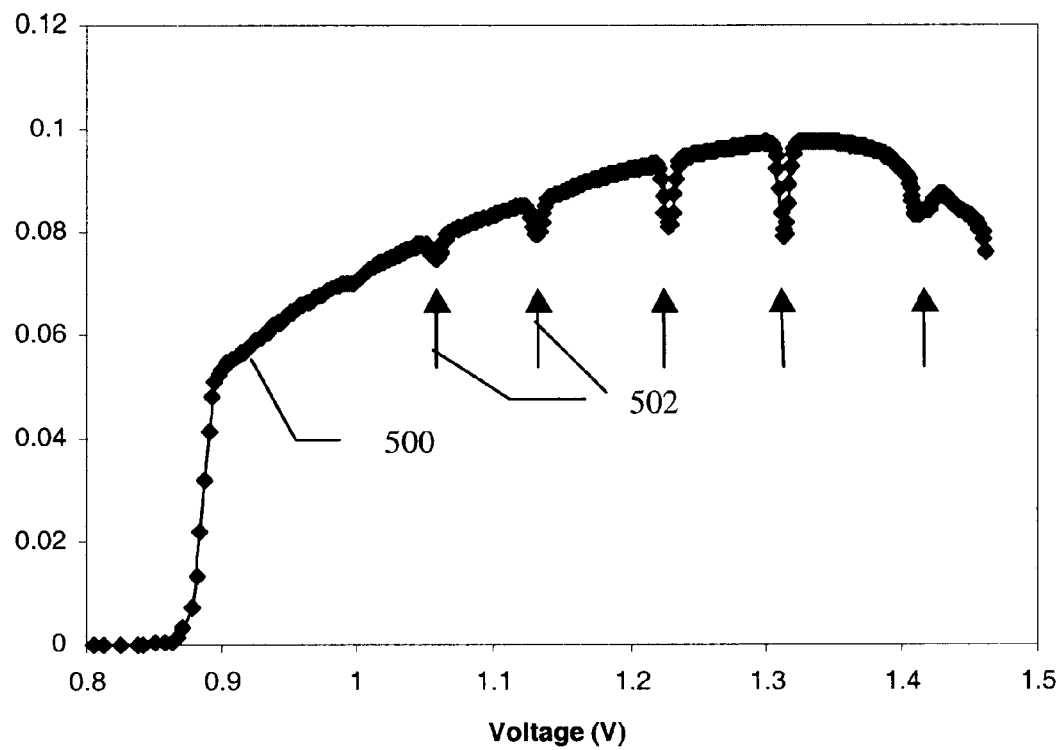
FIG. 5 depicts a typical L-V curve characterizing a multiple-quantum well optoelectronic device in accordance with embodiments of the present invention.

FIG. 5 shows a plot 500 of differential optical gain, dL/dV, as measured on a buried-heterostructure multiple-quantum-well laser. The arrows 502 identify conditions that may be associated with impeded carrier transport.

Under conditions where the onset of strong current flow into a previously unfilled well arises due to field-emission tunneling and the L-V and I-V characteristics exhibit a monotonically increasing character with hysteresis, negative differential conductance characteristic may be employed, as known in the art of electronic devices, for realization of integrated electronic/optical functions. For example, with appropriate electrical feedback, a self-sustaining oscillator may be fabricated, resulting in production of a train of pulses from the laser. Because the behavior is contained within a single compound semiconductor device, most parasitic effects may be avoided, and the period of the pulse train may be made very short. Such a pulse train may subsequently be modulated in order to express information. The pulse shape, arising purely due to internal effects within the device, may exhibit sharper features in time than could be achieved using an external circuit or modulator. Such devices may be of utility in ultra-high-speed, ultra-long-haul communications systems in which return-to-zero and solitonic pulses are required.

It is known that devices exhibiting negative differential conductance may be made, in a simple circuit, to settle stably into local conductance minima. Thus, even if the drive signal is slightly noisy, or if its bias value is slightly off of a desired discrete level, the current and laser emissions can be made to settle into a fixed state determined by the device I-V and L-V characteristics.

Because of its hysteresis characteristic, the state of current and light emission from the device depend not only on the instantaneous applied voltage, but also on the previous state—for example, on whether the new state is approached from below or from above. As such, the devices exhibit memory. They may be used in functions in which it is desired that the previous state(s) of the device influence its behaviour. Such applications include error detection, error correction, and coding for security.

The state of the laser depends not only on applied voltage but also on internal photon density. It is possible to control these variables independently if the laser is driven not only by an external electrical circuit, but is also influenced by injection of light into the waveguide or perpendicular to it. The device may thus be made to serve as an optoelectronic switch, wavelength converter, and optoelectronic multilevel state converter. An array of devices either differently constructed (with different spacings between discrete quantum states) or differently addressed (using different voltages or powers) may serve as optoelectronic multilevel decomposition (demultiplex) engine.

Figure 3:
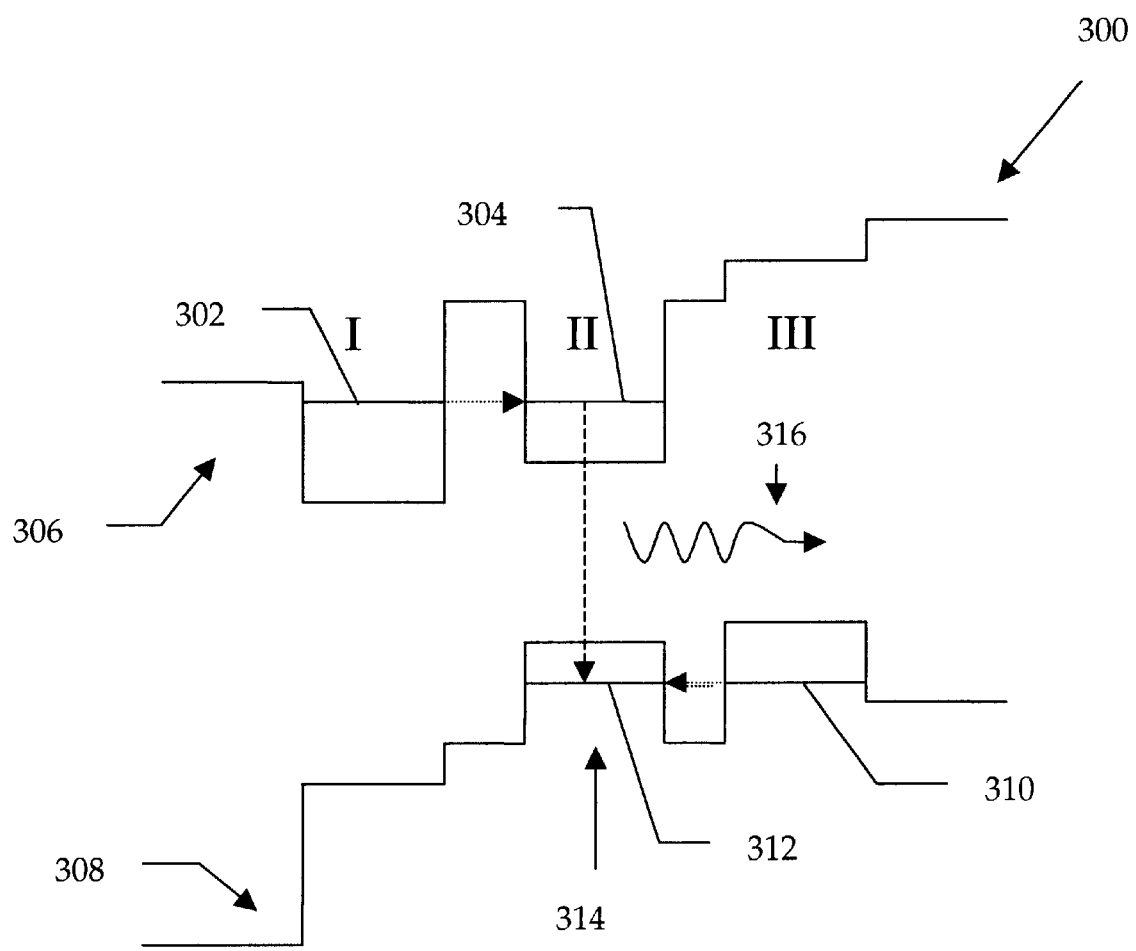
FIG. 3 is an energy-band diagram of a voltage-controlled optical amplifier with resonant tunneling shown in either conduction or valence bands, in accordance with the present invention.

FIG. 3 shows a schematic diagram of a band structure 300 for use, in accordance with preferred embodiments of the present invention, in a voltage-controlled-optical-amplifier. The device is designed for converting a small modulation of electrical voltage to a significant modulation of optical power. An operating device is biased such that the tunneling states 302 and 304 are aligned in the conduction band 306, and/or tunneling states 310 and 312 are aligned in valence band 308. Under this condition, the quantum well is populated, facilitated by resonance tunneling of electrons and holes. If the population inversion of the quantum well 314 is high enough between states 304 and 312, optical gain is achieved, and, when cavity losses are overcome, lasing 316 occurs yielding considerable optical output. Any small deviation of the biasing voltage leads to misalignment of the neighbouring quantum confined states, which results in the ending of resonance tunneling of the carriers. Lasing is then off and no optical output is produced.

In order to achieve the operating modes discussed above, several features are preferable in accordance with preferred embodiments of the invention.

First, quantum wells are realized in which at least one carrier is not effectively transported through thermionic emission. The condition for realizing such a well is that the height of the well exceed kT. Additionally, capture into the wells must be strong, which, like the barrier to thermionic emission, is ensured by separation of the continuum states and the lowest quantum-confined state by a significant multiple of kT at a specified operating temperature. This ensures that the lowest bound state is well below the barrier. At room temperature, for example, this requires that the barrier exceed 26 meV by several times, i.e. probably greater than 100 meV. Solution for the bound state energies given the barrier structure is a standard quantum mechanical calculation.

Second, the quantum wells are preferably designed such that quantum transport is minimal between them except under special circumstances such as alignment of states or barrier bending due to a strong local field. Thus, the thickness of the barrier separating adjacent quantum wells is preferably greater than many times the penetration depth of the confined state wavefunctions inside the wells. Calculation of the penetration depth at a barrier is discussed in detail in standard references such as Ashcroft, et al., *Solid State Physics*, Orlando: Saunders (1976), which is incorporated herein by reference.

As discussed above, it is often advantageous to create a carrier imbalance which may be achieved by allowing one type of carrier to exhibit conventional efficient transport while only the other type of carrier exhibit limited transport as defined above. To achieve this condition, the bandstructure of the device is designed, in accordance with standard heterostructure design practices, such that the above conditions are well fulfilled for one type of carrier but not for the other.

Although various exemplary embodiments of the invention have been disclosed, it should be apparent to those skilled in the art that various changes and modifications can be made that will achieve some of the advantages of the invention without departing from the true scope of the invention. These and other obvious modifications are intended to be covered by the appended claims.

What is claimed is:

1. A non-linear optical semiconductor device comprising:
    a. a stack of a plurality of layers of semiconducting material having at least one quantum well bounded on each of two sides by an energy barrier with respect to transport of a charge carrier between the at least one quantum well and adjoining material on each of two sides, the quantum well having at least two bound quantum states with respect to a trapped charge carrier;
    b. an optically active zone that emits light, the optically active zone including the at least one quantum well, the optically active zone characterized by an optical gain;
    c. a carrier injector for forward-injecting carriers of a first conductivity type into the at least one quantum well; and
    d. a second carrier injector for forward-injecting carriers of a second conductivity type into the optically active zone in such a way as to vary the optical gain of the optically active zone.

2. A device in accordance with claim 1, wherein the at least one quantum well is bounded by two barriers with respect to the transport of holes.

3. A device in accordance with claim 1, wherein the at least one quantum well is bounded by two barriers with respect to the transport of electrons.

4. A device in accordance with claim 1, wherein the at least one quantum well is bounded by two barriers each differentially limiting the transport of holes and electrons.

5. A device in accordance with claim 1, wherein at least one barrier is approximately triangular, so as to enable field-emission through the at least one barrier.

6. A device in accordance with claim 1, wherein thermionic transport of at least one carrier type into the at least one quantum well is precluded at a specified operating temperature.

7. A device in accordance with claim 1, wherein transport of at least one carrier type into the at least one quantum well is by means of resonant tunneling.

8. A device in accordance with claim 1, wherein transport of at least one carrier type into the at least one quantum well is by means of field-emission tunneling.

9. A non-linear optical semiconductor device comprising:
    a. a stack of a plurality of layers of semiconducting material having at least one quantum well bounded on each of two sides by an energy barrier with respect to transport of a charge carrier between the at least one quantum well and adjoining material on each of two sides, such that electrical current through the stack is a nonlinear function of an applied electrical potential across the stack; and
    b. a circuit for modulating an optical gain of a region of the stack by virtue of the nonlinear function of current versus applied electrical potential.

10. A device in accordance with claim 9, wherein the nonlinear function has hysteresis.

11. An optical semiconductor device, comprising:
    a first and a second quantum well separated from each other by a barrier, each quantum well having at least one quantum state with respect to a trapped charge carrier, the at least one quantum state of the first quantum well being substantially aligned with the at least one quantum state of the second quantum well to enable current to flow across the barrier from the first quantum well to the second quantum well, the current inducing population inversion in the second quantum well that produces an optical output.

12. A device in accordance with claim 11, wherein the current includes a flow of holes.

13. A device in accordance with claim 11, wherein the current includes a flow of electrons.

14. A device in accordance with claim 11, wherein the barrier is approximately triangular.

15. A device in accordance with claim 11, further comprising a third quantum well separated from the second quantum well by a second barrier, the third quantum well having at least one quantum state that is substantially aligned with the at least one quantum state of the second quantum well to enable current to flow across the second barrier from the third quantum well to the second quantum well.

16. A device in accordance with claim 15, wherein the current flowing from the first quantum well flows to a different quantum state of the second quantum well than the current flowing from the third quantum well to a quantum state of the second quantum well.

17. A device in accordance with claim 15, wherein the current flowing from the first quantum well to the second quantum well includes a flow of electrons and the current flowing from the third quantum well to the second quantum well includes a flow of holes.

* * * * *